US012494762B2

(12) United States Patent
Yu et al.

(10) Patent No.: US 12,494,762 B2
(45) Date of Patent: Dec. 9, 2025

(54) IMPEDANCE MATCHING APPARATUS

(71) Applicant: Skyworks Solutions, Inc., Irvine, CA (US)

(72) Inventors: Bo Yu, San Diego, CA (US); Bo Pan, Irvine, CA (US); Johannes Jacobus Emile Maria Hageraats, Kamuela, HI (US)

(73) Assignee: Skyworks Solutions, Inc., Irvine, CA (US)

( * ) Notice: Subject to any disclaimer, the term of this patent is extended or adjusted under 35 U.S.C. 154(b) by 181 days.

(21) Appl. No.: 18/239,675

(22) Filed: Aug. 29, 2023

(65) Prior Publication Data

US 2024/0072755 A1    Feb. 29, 2024

Related U.S. Application Data

(60) Provisional application No. 63/402,403, filed on Aug. 30, 2022.

(51) Int. Cl.
*H03H 7/38* (2006.01)
*H03F 3/189* (2006.01)
*H03H 7/42* (2006.01)

(52) U.S. Cl.
CPC ............... *H03H 7/38* (2013.01); *H03F 3/189* (2013.01); *H03H 7/42* (2013.01); *H03F 2200/294* (2013.01)

(58) Field of Classification Search
CPC .. H03H 7/38; H03H 7/42; H03F 3/189; H03F 2200/294; H03F 2203/45621; H03F 3/195; H03F 3/45475; H03F 2200/451; H03F 1/565
See application file for complete search history.

(56) References Cited

U.S. PATENT DOCUMENTS

| | | | |
|---|---|---|---|
| 6,198,374 B1 * | 3/2001 | Abel | H01F 17/0013 336/200 |
| 8,254,862 B2 | 8/2012 | Kasha et al. | |
| 8,264,297 B2 | 9/2012 | Thompson | |
| 9,450,541 B2 | 9/2016 | Beltran Lizarraga et al. | |
| 9,467,115 B2 | 10/2016 | Lyalin | |
| 9,800,207 B2 | 10/2017 | Datta et al. | |
| 9,853,610 B2 | 12/2017 | Beltran Lizarraga et al. | |
| 9,866,196 B2 | 1/2018 | Gorbachov | |
| 9,912,299 B2 | 3/2018 | Lyalin | |
| 10,355,647 B2 | 7/2019 | Datta et al. | |
| 10,439,575 B1 * | 10/2019 | Kuo | H03F 3/265 |
| 10,566,946 B2 | 2/2020 | Gorbachov | |

(Continued)

*Primary Examiner* — John W Poos
(74) *Attorney, Agent, or Firm* — Knobbe. Martens, Olson & Bear, LLP

(57) ABSTRACT

An impedance matching apparatus for providing impedance matching for an RF component. The apparatus includes a balun transformer circuit having a primary coil at an input side of the balun transformer circuit. The primary coil can be connected to a signal source to receive an input signal from the signal source. The balun transformer circuit further includes a secondary coil at an output side of the balun transformer circuit, the secondary coil being coupled to the primary coil to supply an output signal to the RF component and having a parasitic leakage inductance configured to match the output impedance of the signal source to the input impedance of the RF component

20 Claims, 6 Drawing Sheets

(56) References Cited

U.S. PATENT DOCUMENTS

| | | |
|---|---|---|
| 11,018,714 B2 | 5/2021 | Arfaei Malekzadeh et al. |
| 11,283,416 B2 | 3/2022 | Cao et al. |
| 11,374,610 B2 | 6/2022 | Arfaei Malekzadeh et al. |
| 11,469,725 B2 | 10/2022 | Cao et al. |
| 11,616,485 B2 | 3/2023 | Azizi |
| 11,626,855 B2 | 4/2023 | Azizi |
| 11,764,734 B2 | 9/2023 | Datta et al. |
| 11,916,577 B2 | 2/2024 | Pehlke |
| 11,990,877 B2 | 5/2024 | Cao et al. |
| 2004/0102175 A1* | 5/2004 | Rofougaran ............ H03F 3/19 455/313 |
| 2019/0097594 A1 | 3/2019 | Soliman |
| 2020/0127605 A1* | 4/2020 | Vida .................. H03H 7/38 |
| 2022/0006437 A1* | 1/2022 | Namie ................ H03G 1/0088 |
| 2022/0190803 A1 | 6/2022 | Azizi et al. |
| 2023/0020495 A1 | 1/2023 | Lehtola et al. |
| 2023/0112435 A1 | 4/2023 | Naseri Ali Abadi et al. |
| 2023/0291378 A1 | 9/2023 | Azizi |
| 2023/0299729 A1 | 9/2023 | Chen et al. |
| 2023/0344393 A1 | 10/2023 | Nuzum et al. |
| 2023/0344395 A1 | 10/2023 | Nuzum et al. |
| 2023/0361724 A1 | 11/2023 | Chen et al. |
| 2023/0402988 A1 | 12/2023 | Datta et al. |
| 2024/0072755 A1 | 2/2024 | Yu et al. |

\* cited by examiner

IMPEDANCE MATCHING APPARATUS

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

BACKGROUND

Field

Embodiments of the invention relate to front-end modules and in particular to an impedance matching apparatus to provide impedance matching for an RF component.

Description of the Related Technology

Front-end modules are widely used in communication systems to enlarge communication bandwidth and to increase data rates correspondingly. Meanwhile, a front-end module may reduce communication latency. Due to attenuation, a low-noise amplifier (LNA) can be used to boost the signal-to-noise ratio (SNR) and achieve high data rate communication. Impedance matching between a signal source and the low noise amplifier (LNA) can be provided by an impedance matching network. However conventional impedance networks can comprise a relative large chip area when integrated in a chip. Moreover, conventional impedance networks have a common mode rejection ratio (CMRR) that can be limited by inter-coil parasitic electrical/capacitive coupling.

SUMMARY

In some aspects, the techniques described herein relate to an impedance matching apparatus for providing impedance matching for an radio frequency component, including: a balun transformer circuit including a primary coil at an input side of the balun transformer circuit, the primary coil being connected to a signal source to receive an input signal from the signal source, the balun transformer circuit further including a secondary coil at an output side of the balun transformer circuit, the secondary coil being coupled to the primary coil to supply an output signal to the radio frequency component and having a parasitic leakage inductance configured to match an output impedance of the signal source to an input impedance of the radio frequency component.

In some aspects, the techniques described herein relate to an impedance matching apparatus wherein the parasitic leakage inductance of the balun transformer circuit is configured to include a predefined coupling factor, k.

In some aspects, the techniques described herein relate to an impedance matching apparatus wherein a coupling factor, k, is defined by an implemented offset between the primary coil and the secondary coil of the balun transformer circuit.

In some aspects, the techniques described herein relate to an impedance matching apparatus wherein a coupling factor, k, is defined by an implemented gap, G, between the primary coil of the balun transformer circuit and the secondary coil of the balun transformer circuit.

In some aspects, the techniques described herein relate to an impedance matching apparatus wherein a coupling factor, k, is defined by an implemented winding ratio, R, of a number of windings of the primary coil and a number of windings of the secondary coil.

In some aspects, the techniques described herein relate to an impedance matching apparatus wherein the primary coil and the secondary coil of the balun transformer circuit are implemented on different layers of an integrated circuit.

In some aspects, the techniques described herein relate to an impedance matching apparatus wherein a cross section area of the primary coil overlaps with a cross section area of the secondary coil of the balun transformer circuit to reduce a chip area of the balun transformer circuit within the integrated circuit.

In some aspects, the techniques described herein relate to an impedance matching apparatus wherein the cross section area of the primary coil and the cross section area of the secondary coil of the balun transformer circuit are square shaped.

In some aspects, the techniques described herein relate to an impedance matching apparatus wherein the impedance matching apparatus is integrated into the radio frequency component.

In some aspects, the techniques described herein relate to an impedance matching apparatus wherein the impedance matching apparatus is a component provided on a printed circuit board In some aspects, the techniques described herein relate to an impedance matching apparatus wherein the signal source connected to the input side of the balun transformer circuit includes a signal antenna proving a single-ended signal to input side of the balun transformer circuit.

In some aspects, the techniques described herein relate to an impedance matching apparatus wherein the radio frequency component includes a differential low-noise amplifier having a differential input connected to the output side of the balun transformer circuit.

In some aspects, the techniques described herein relate to an impedance matching apparatus wherein the differential low-noise amplifier includes a differential 5G low-noise amplifier.

In some aspects, the techniques described herein relate to a front-end module including: an radio frequency component; and an impedance matching apparatus to provide impedance matching for the radio frequency component, the impedance matching apparatus including a balun transformer circuit including a primary coil at an input side of the balun transformer circuit, the primary coil being connected to a signal source to receive an input signal from the signal source, and a secondary coil at an output side of the balun transformer circuit, the secondary coil being coupled to the primary coil to supply an output signal to the radio frequency component and having a parasitic leakage inductance used to match an output impedance of the signal source to an input impedance of the radio frequency component.

In some aspects, the techniques described herein relate to a front-end module wherein the parasitic leakage inductance of the balun transformer circuit of the impedance matching apparatus is configured to include a predefined coupling factor, k.

In some aspects, the techniques described herein relate to a front-end module wherein a coupling factor, k, is defined by an implemented offset between the primary coil and the secondary coil of the balun transformer circuit In some aspects, the techniques described herein relate to a front-end module wherein a coupling factor, k, is defined by an implemented gap, G, between the primary coil of the balun transformer circuit and the secondary coil of the balun transformer circuit.

In some aspects, the techniques described herein relate to a front-end module wherein a coupling factor, k, is defined by an implemented winding ratio, R, of a number of windings of the primary coil and a number of windings of the secondary coil.

In some aspects, the techniques described herein relate to a front-end module wherein the primary coil and the secondary coil of the balun transformer circuit are implemented on different layers of an integrated circuit.

In some aspects, the techniques described herein relate to a front-end module wherein a cross-section area of the primary coil overlaps with a cross-section area of the secondary coil of the balun transformer circuit to reduce a chip area of the balun transformer circuit within the integrated circuit.

In some aspects, the techniques described herein relate to a front-end module wherein a cross-section area of the primary coil and a cross-section area of the secondary coil of the balun transformer circuit are square-shaped.

In some aspects, the techniques described herein relate to a front-end module wherein the impedance matching apparatus is integrated into the radio frequency component.

In some aspects, the techniques described herein relate to a front-end module wherein the impedance matching apparatus is a component provided on a printed circuit board.

In some aspects, the techniques described herein relate to a front-end module wherein the signal source connected to the input side of the balun transformer circuit includes a signal antenna proving a single-ended signal to input side of the balun transformer circuit.

In some aspects, the techniques described herein relate to a front-end module wherein the radio frequency component includes a differential low-noise amplifier having a differential input connected to the output side of the balun transformer circuit.

In some aspects, the techniques described herein relate to a front-end module wherein the differential low-noise amplifier includes a differential 5G low-noise amplifier.

In some aspects, the techniques described herein relate to a 5G mm wave device including: a front-end module, the front-end module including an radio frequency component and an impedance matching apparatus to provide impedance matching for the radio frequency component, the impedance matching apparatus including a balun transformer circuit including a primary coil at an input side of the balun transformer circuit, the primary coil being connected to a signal source to receive an input signal from the signal source, and a secondary coil at an output side of the balun transformer circuit, the secondary coil being coupled to the primary coil to supply an output signal to the radio frequency component and having a parasitic leakage inductance used to match an output impedance of the signal source to an input impedance of the radio frequency component.

In some aspects, the techniques described herein relate to a 5G mm wave device wherein the parasitic leakage inductance of the balun transformer circuit of the impedance matching apparatus is configured to include a predefined coupling factor, k.

In some aspects, the techniques described herein relate to a 5G mm wave device wherein a coupling factor, k, is defined by an implemented offset between the primary coil and the secondary coil of the balun transformer circuit.

In some aspects, the techniques described herein relate to a 5G mm wave device wherein a coupling factor, k, is defined by an implemented gap, G, between the primary coil of the balun transformer circuit and the secondary coil of the balun transformer circuit.

In some aspects, the techniques described herein relate to a 5G mm wave device wherein a coupling factor, k, is defined by an implemented winding ratio, R, of a number of windings of the primary coil and a number of windings of the secondary coil.

In some aspects, the techniques described herein relate to a 5G mm wave device wherein the primary coil and the secondary coil of the balun transformer circuit are implemented on different layers of an integrated circuit.

In some aspects, the techniques described herein relate to a 5G mm wave device wherein a cross-section area of the primary coil overlaps with a cross section area of the secondary coil of the balun transformer circuit to reduce a chip area of the balun transformer circuit within the integrated circuit.

In some aspects, the techniques described herein relate to a 5G mm wave device wherein a cross-section area of the primary coil and a cross-section area of the secondary coil of the balun transformer circuit are square-shaped.

In some aspects, the techniques described herein relate to a 5G mm wave device wherein the impedance matching apparatus is integrated into the radio frequency component.

In some aspects, the techniques described herein relate to a 5G mm wave device wherein the impedance matching apparatus is a component provided on a printed circuit board.

In some aspects, the techniques described herein relate to a 5G mm wave device wherein the signal source connected to the input side of the balun transformer circuit includes a signal antenna proving a single-ended signal to input side of the balun transformer circuit.

In some aspects, the techniques described herein relate to a 5G mm wave device wherein the radio frequency component includes a differential low-noise amplifier having a differential input connected to the output side of the balun transformer circuit.

In some aspects, the techniques described herein relate to a 5G mm wave device wherein the differential low-noise amplifier includes a differential 5G low-noise amplifier.

DETAILED DESCRIPTION OF EMBODIMENTS

Figure 1:
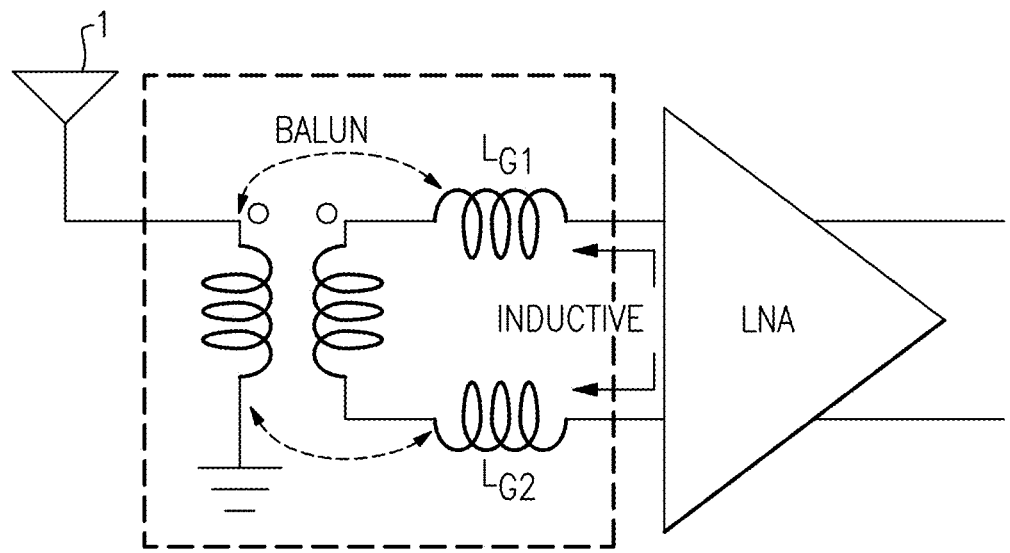
FIG. 1 is a circuit diagram of a conventional differential LNA input matching network.

FIG. 1 shows a conventional differential LNA input matching network. The circuit illustrated in FIG. 1 comprises a differential architecture used to suppress a noise from the surrounding environment and to reject a common mode signal. A balun based input network can convert a single-ended signal received from an antenna A to differential signals. The differential signals are fed to differential LNA inputs of a low-noise amplifier LNA as illustrated in FIG. 1. As can be seen in FIG. 1, gate inductors LG1, LG2 are provided as matching components to help to generate a resonance for a capacitive loading of the input nodes of the low-noise amplifier LNA. Hence, in the conventional differential LNA input matching network illustrated in FIG. 1, the balun based input network is cascaded with a pair of gate inductors LG1, LG2 between the antenna A and the input nodes of the low-noise amplifier LNA as illustrated in FIG. 1. However, the separate components occupy a large chip area as can also be seen from FIG. 3.

Figure 3:
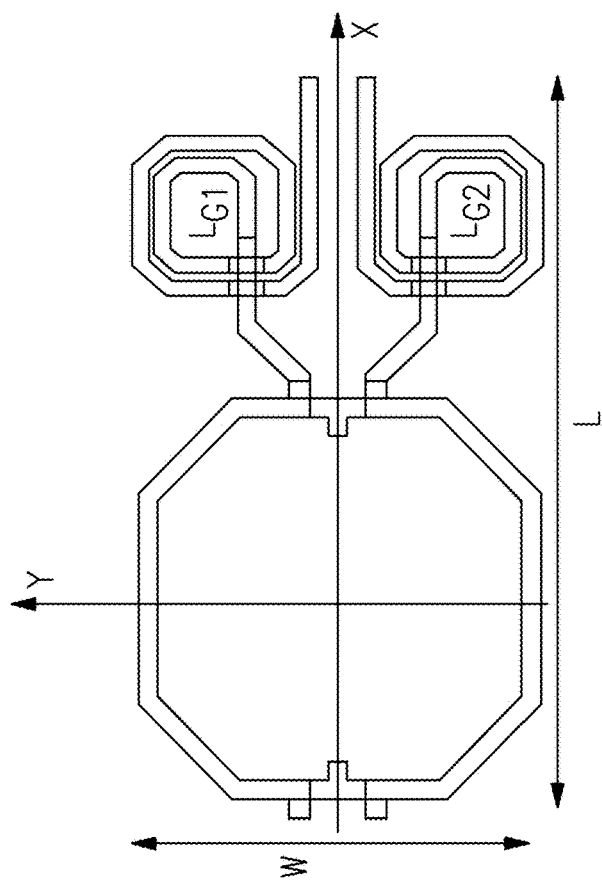
FIG. 3 shows a possible implementation of a conventional LNA input matching network as illustrated in FIG. 1.

FIG. 3 shows a possible implementation of the conventional differential LNA input matching network of FIG. 1. The balun transformer circuit comprises a primary coil and a secondary coil which can be stacked upon each other on different layers. The primary coil can be connected to a signal source such as the antenna A illustrated in FIG. 1. The secondary coil is connected to a pair of gate inductors LG1, LG2 as shown in FIG. 3. As can be seen from FIG. 3, the conventional differential LNA input matching network illustrated in FIG. 1 occupies a chip area defined by a length L and a width W as shown in FIG. 3. The conventional LNA input matching network shown in FIGS. 1 and 3 occupies a relatively large chip area. Moreover, the coupling between the balun transformer circuit and the gate inductors can degrade the common mode rejection performance of the conventional circuit illustrated in FIGS. 1 and 3.

Figure 2:
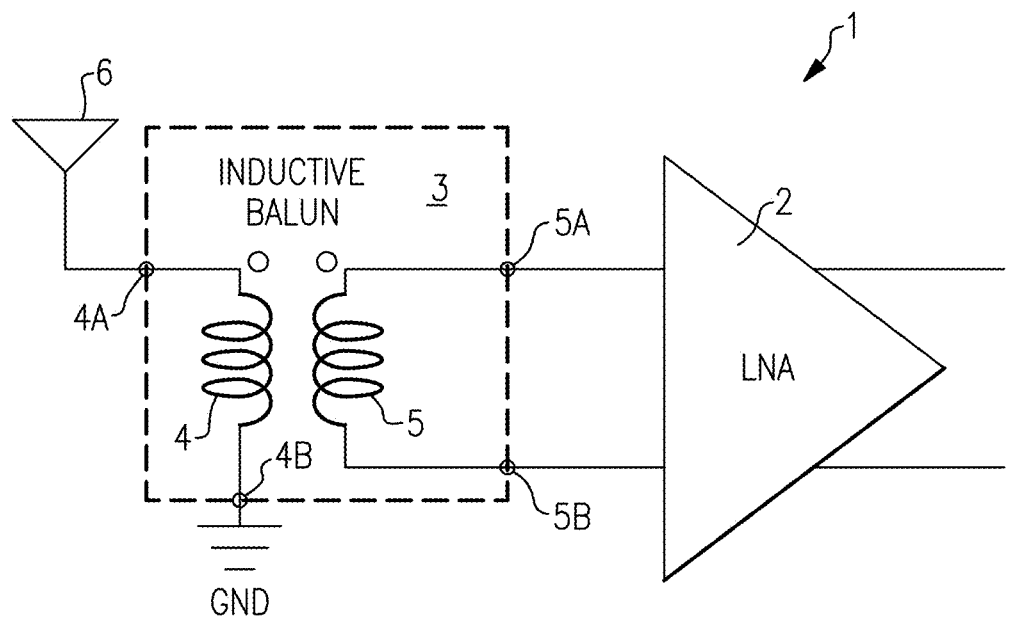
FIG. 2 is a circuit diagram for illustrating a possible exemplary embodiment of an impedance matching apparatus comprising a balun transformer circuit.

FIG. 2 shows a circuit diagram of a possible exemplary embodiment of an impedance matching apparatus 1 according to an aspect of the present invention. The impedance matching apparatus 1 provides impedance matching for an RF component. In the illustrated embodiment of FIG. 2, the RF component is implemented in the form of a low noise amplifier LNA 2, for example. The impedance matching apparatus 1 used to provide impedance matching for the RF component comprises a balun transformer circuit 3 as shown in FIG. 2. The balun transformer circuit 3 comprises a primary coil 4 provided at an input side of the balun transformer circuit 3 and a secondary coil 5 at an output side of the balun transformer circuit 3. The secondary coil 5 at the output side of the balun transformer circuit 3 is coupled to the primary coil 4 to supply an output signal to the RF component. The primary coil 4 at the input side of the balun transformer circuit 3 is connected to a signal source 6 to receive an input signal. In the illustrated embodiment of FIG. 2, the signal source 6 is formed by an antenna. In the impedance matching apparatus 1 as shown in FIG. 2 comprising the balun transformer circuit 3, a parasitic leakage inductance is used to match the output impedance of the signal source 6 to the input impedance of the RF component, in particular to the input impedance of the low noise amplifier 2 shown in the embodiment of FIG. 2. In the impedance matching apparatus 1, the leakage inductance LLeak of the balun transformer circuit 3 is leveraged so that the implementation of separate gate inductors LG is no longer required.

Figure 4:
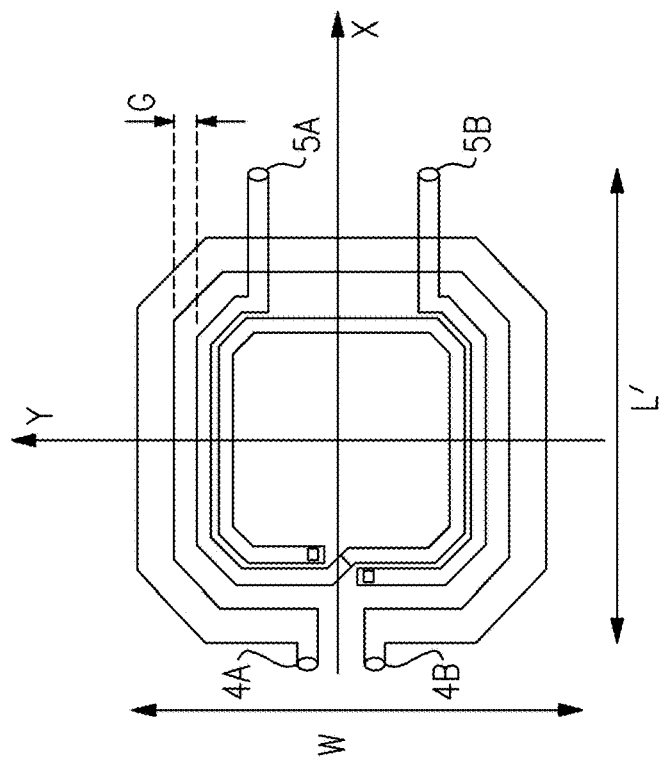
FIG. 4 shows an exemplary implementation of an impedance matching apparatus as illustrated in FIG. 2.

FIG. 4 illustrates a possible implementation of the impedance matching apparatus 1 in a balun transformer circuit 3 as illustrated in FIG. 2. As can be seen from FIG. 4, by making use of the leakage inductance LLeak of the balun transformer circuit 3, the impedance matching apparatus 1 does not require the provision of separate gate inductors LG as used in a conventional implementation as illustrated in FIG. 3. As can be seen in FIG. 2, the chip area occupied by the impedance matching apparatus 1 and defined by the product of the length L' and width W' is significantly smaller than the chip area required by the conventional input matching network implemented as illustrated in FIG. 3 and defined by the product of length L and width W. With the impedance matching apparatus 1 according to embodiments disclosed herein, a reduction of required chip area of at least 40% may be achieved.

The parasitic leakage inductance LLeak of the balun transformer circuit 3 depends on a coupling factor k. The coupling factor k depends on an implemented offset in the xy plane between the primary coil 4 and the secondary coil 5 of the balun transformer circuit 3. The coupling factor k depends also on the implemented gap G between the primary coil 4 of the balun transformer circuit 3 and the secondary coil 5 of the balun transformer circuit 3. Moreover, the coupling factor k depends also on the implemented winding ratio R of the number w1 of windings of the primary coil 4 and a number w2 of windings of the secondary coil 5. As can be seen from the implementation illustrated in FIG. 4, the implemented balun transformer circuit 3 comprises a primary coil 4 with a single winding (w1=1) surrounding a secondary coil 5 comprising two windings (w2=2). The offset, the gap G and the winding ratio R form design parameters which can be varied to adjust the parasitic leakage inductance LLeak of the balun transformer circuit 3 during chip design.

The balun transformer circuit 3 comprises an input defined by the connections 4A, 4B of the primary coil 4. The balun transformer circuit 3 further comprises a signal output defined by the output connections 5A, 5B of the secondary coil 5. The output connections 5A, 5B of the secondary coil 5 are directly connected to the input nodes of the RF component, e.g. the low-noise amplifier 2. Separate gate inductors are not necessarily required, i.e. the output connections 5A, 5B of the secondary coil 5 may be directly connected to the signal input of the low noise amplifier 2.

The input connections 4A, 4B of the primary coil 4 form the signal input of the impedance matching apparatus 1. In the illustrated embodiment of FIG. 2, the input connection 4A of the primary coil 4 can be connected to the signal source 6 formed by an antenna to receive an input signal. The other input connection 4B of the primary coil 4 may be connected to ground GND as also illustrated in FIG. 2.

In a possible embodiment, the primary coil 4 and the secondary coil 5 of the balun transformer circuit 3 can be implemented on different layers of an integrated circuit. In the illustrated implementation of FIG. 4, the primary coil 4 surrounds the secondary coil 5 so that the cross-section area of the primary coil 4 overlaps with the cross-section area of the secondary coil 5 of the balun transformer circuit 3. This overlap reduces the required chip area of the balun transformer circuit 3 within the integrated circuit.

The cross-section area of the primary coil 4 and the cross-section area of the secondary coil 5 of the balun transformer circuit 3 are essentially square-shaped, as shown in the example FIG. 4. This further reduces the required chip area of the balun transformer circuit 3 within the integrated circuit. In a possible embodiment, the chip area is defined by the length L' and the width W' of the primary coil 4 surrounding the secondary coil 5. In a possible implementation, the dimension of the length L' and width W' of the primary coil 4 are in a range between 100 and 200 µm, for instance 116 µm. The overlap of the cross-section areas of the primary coil 4 and the secondary coil 5 of the balun transformer circuit 3 increases the common mode rejection ratio CMRR. Further, the LNA gain of the low-noise amplifier 2 is boosted and at the same time, the noise figure NF is reduced.

As shown in FIG. 4, the primary coil 4 surrounds the secondary coil 5 with a predefined gap G. In the implementation illustrated in FIG. 2, the balun transformer circuit 3 is formed symmetrically along both axes x, y. The primary coil 4 and the secondary coil 5 are implemented in an essentially square shape, as illustrated in the example of FIG. 2. Further, the gap G between the secondary coil 5 and the primary coil 4 is essentially constant along the circumference of the coils.

The coupling factor k between the primary coil 4 and the secondary coil 5 depends on the offset between the primary coil 4 and the secondary coil 5, the gap G between the primary coil 4 and the secondary coil 5 and also depends on the winding ratio R of the number w1 of windings of the primary coil 4 and a number w2 of windings of the secondary coil 5. Accordingly, the offset, gap G and winding ratios form design parameters which can be used to define the coupling factor k between the primary coil 4 and the secondary coil 5.

The parasitic leakage inductance of the balun transformer circuit 3 depends on the coupling factor k. Consequently, changing the offset between the primary coil 4 and the secondary coil 5, changing the provided gap G between the primary coil 4 and the secondary coil 5, changing the winding ratio R of at least one of the primary coil 4 and the secondary coil 5, or any combination of such, leads to the parasitic leakage inductance L Leak of the balun transformer circuit 3 to be configured to match the output impedance Z out of the signal source 6 such as the antenna illustrated in FIG. 2 to the input impedance Z in of the RF component such as the input impedance of the low-noise amplifier 2 illustrated in FIG. 2.

Figure 5A:
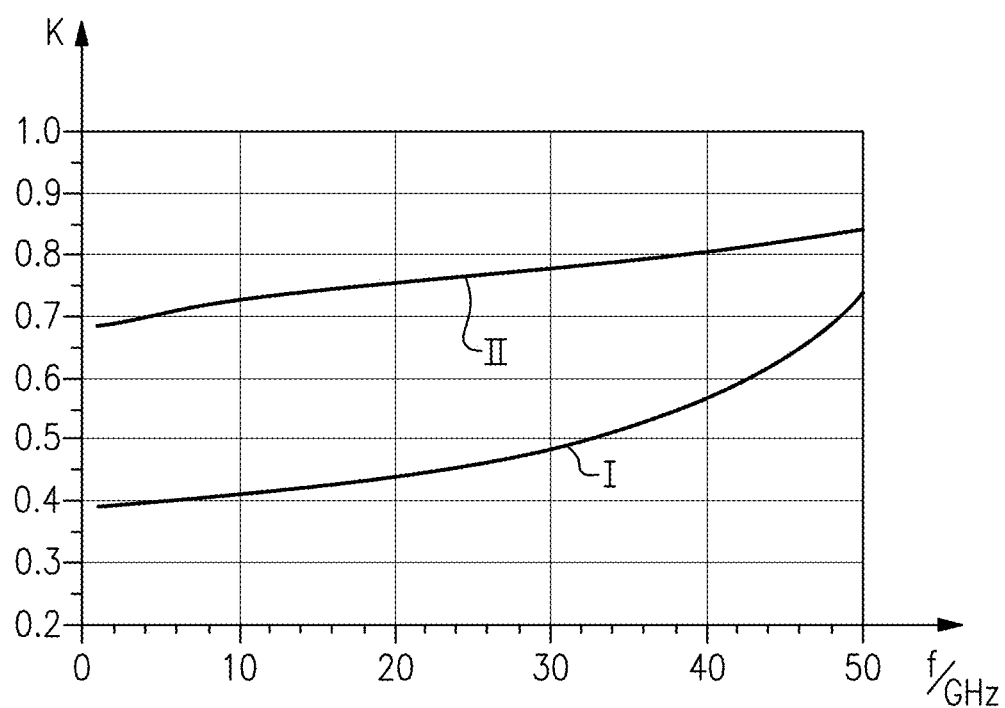
FIGS. 5A to 5C show diagrams for illustrating a performance comparison between a conventional differential LNA input matching network as illustrated in FIG. 1 and an impedance matching apparatus as illustrated in the circuit diagram of FIG. 2.
Figure 5B:
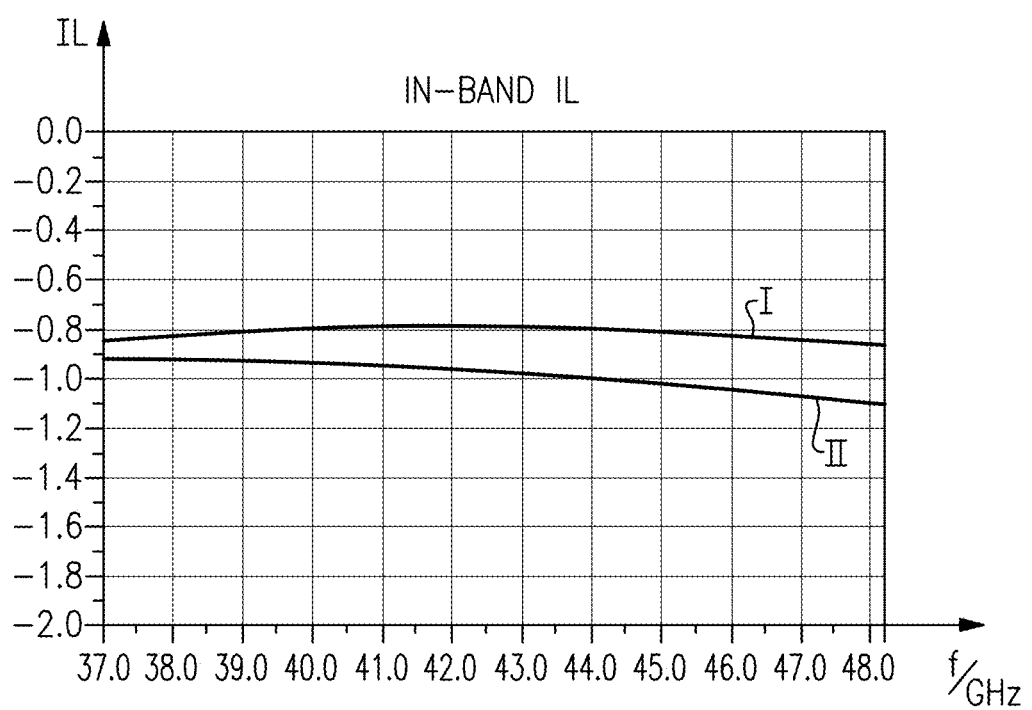
Figure 5C:
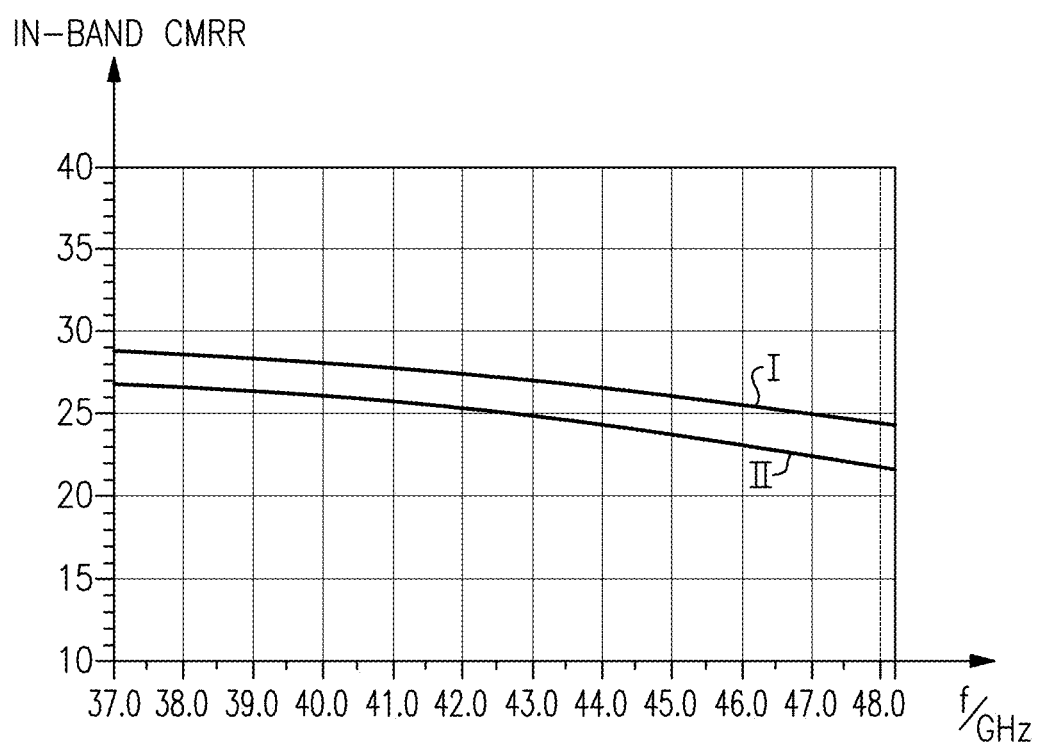

FIGS. 5A, 5B and 5C illustrate a performance comparison between the performance of the conventional differential LNA input matching network illustrated in FIG. 1 and the performance of an impedance matching apparatus 1 according to some embodiments described herein, for example as illustrated in FIG. 2.

FIG. 5A shows a coupling coefficient k depending on a signal frequency f. As can be seen from FIG. 5A, the coupling factor k of the balun transformer circuit 3 used as the impedance matching apparatus 1 as illustrated in FIGS. 2 and 4 represented by curve I has a lower coupling factor k than the conventional differential LNA input matching network illustrated in FIGS. 1 and 3 represented by curve II.

A slope of the coupling factor k(f) as a function of a frequency f can be engineered using the design factors of the implementation illustrated in FIG. 4, in particular the gap G between the primary coil 4 and the secondary coil 5, the offset between the primary coil 4 and the secondary coil 5 both in x direction and in y direction as well as the number of windings w of the primary coil 4 and of the secondary coil 5.

FIG. 5B shows the insertion loss IL of a conventional differential LNA input matching network as illustrated in FIGS. 1 and 3 represented by curve II in comparison to the insertion loss IL of an impedance matching apparatus 1 according to some embodiments described herein represented by curve I.

FIG. 5C illustrates an in-band common mode rejection ratio CMRR as a function of the frequency f for a conventional differential LNA input matching network as illustrated in FIGS. 1, 3 (curve II) and for an impedance matching apparatus 1 according to an exemplary embodiment disclosed herein (curve I). As becomes evident from FIG. 5C, the impedance matching apparatus 1 has a significant higher common mode rejection ratio CMRR when compared to the conventional input matching network. The approach taken by the impedance matching apparatus 1 according to the present invention provides an increase of the common mode rejection ratio (CMRR) due to a less capacitive overlap, i.e. because of reduced inter-coil parasitic electrical/capacitive coupling.

The impedance matching apparatus 1 provides impedance matching for an RF component such as a low-noise amplifier 2. The LNA gain can be boosted by getting rid of the gate inductors LG. For instance, the LNA gain can be boosted from around 8 dB to 10 dB, i.e. providing a 2 dB improvement.

Further, the noise figure NF can be improved in some embodiments by approximately 0.5 dB. The impedance matching apparatus 1 according to some embodiments described herein does not only save the chip area in an integrated circuit but also improves the LNA gain. It further reduces the noise figure NF and increases the common mode rejection ratio CMRR. The improvement with respect to the noise figure NF represents a major performance benefit provided by the impedance matching apparatus 1.

The impedance matching apparatus 1 can form a component provided on a printed circuit board PCB. In some embodiments described herein, the signal source 6 connected to the input side of the balun transformer circuit 3 of the impedance matching apparatus 1 can comprise a signal antenna providing a single-ended signal to the input side of the balun transformer circuit 3 as illustrated in the circuit diagram of FIG. 2. The RF component comprises a differential low noise amplifier (LNA) 2 having a differential input connected to the output side of the balun transformer circuit 3. This differential low noise amplifier (LNA) 2 can comprise, in some embodiments, a differential 5G low noise amplifier.

Figure 6:
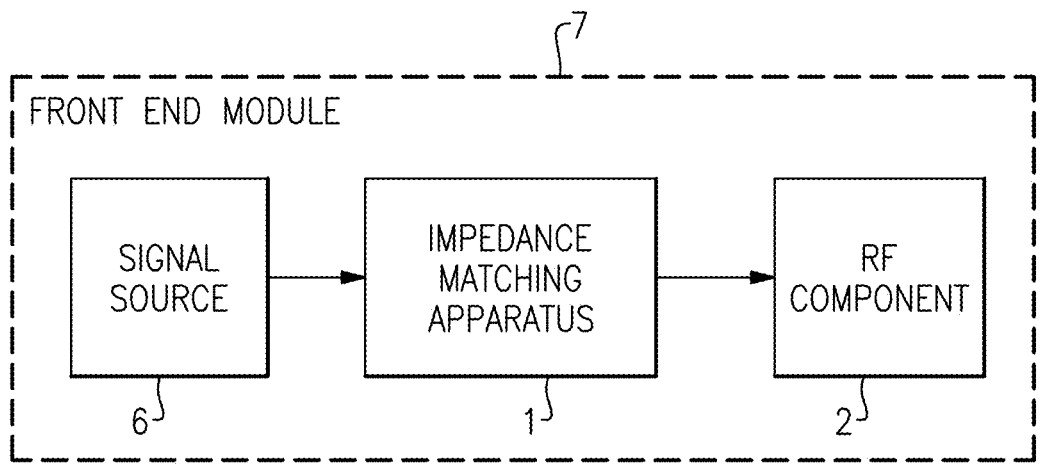
FIG. 6 shows a schematic block diagram of a front-end module including an impedance matching apparatus as illustrated in FIG. 2.

A front-end module 7 including some or all of the features and embodiments disclosed herein is illustrated schematically in the block diagram of FIG. 6. The front-end module 7 comprises a signal source 6 such as an antenna illustrated in FIG. 2. Other kinds of signal sources 6 are possible providing either signal-ended signals or differential signals.

The front-end module 7 comprises an impedance matching apparatus 1 formed by a balun transformer circuit 3 connected between the signal source 6 and an RF component such as a low noise amplifier 2. The balun transformer circuit 3 has a primary coil 4 provided at an input side of the balun transformer circuit 3 and connected to the signal source 6 to receive an input signal from the signal source 6. The balun transformer circuit 3 further comprises a secondary coil 5 at an output side of the balun transformer circuit 3 to supply an output signal to the RF component.

The primary coil 4 and the secondary coil 5 are coupled with each other with a coupling factor k. The balun transformer circuit 3 comprises a parasitic leakage inductance LLeak used to match the output impedance Zout of the signal source 6 to the input impedance Zin of the RF component 2. In a possible embodiment, the parasitic leakage inductance LLeak of the balun transformer circuit 3 is used to match the output impedance Zout of an antenna 6 to the input impedance Zin of a low noise amplifier 2 as illustrated in the circuit diagram of FIG. 2.

Figure 7:
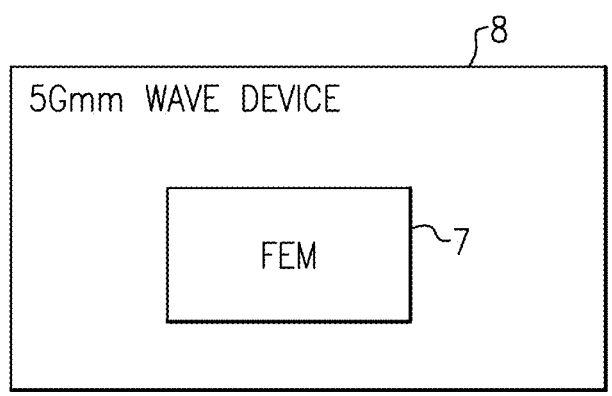
FIG. 7 shows a schematic block diagram for illustrating a 5G wave device comprising a front-end module as illustrated in FIG. 6.

The front-end module 7 as shown in the block diagram of FIG. 6 can form part of a 5G millimeter (mm) wave device 8 as shown schematically in FIG. 7. The 5G mm wave device 8 comprises at least one front-end module 7. The front-end module 7 comprises an RF component and an impedance matching apparatus 1 including a balun transformer circuit 3. Such a 5G front-end module 7 as shown in FIG. 7 may form a module of a 5G communication system. The RF component of the 5G front-end module 7 can comprise a low noise figure 5G millimeter wave low noise amplifier LNA adapted to reduce the signal-to-noise ratio (SNR) that may be used to achieve high rates of data communication in a 5G communication system.

While certain embodiments of the invention have been described, these embodiments have been presented by way of example only, and are not intended to limit the scope of the disclosure. The novel apparatus 1 and system described herein can be embodied in a variety of other forms. Furthermore, various omissions, substitutions and changes in the form of the apparatus 1 and system described herein may be made without departing from the spirit of the disclosure. The accompanying claims and the equivalents are intended to cover such forms of modifications as would fall within the scope and spirit of the disclosure.

Aspects of this disclosure can be implemented in various electronic devices. Examples of the electronic devices can include, but are not limited to, consumer electronic products, parts of the consumer electronic products such as packaged radio frequency modules, radio frequency filter die, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a microwave, a refrigerator, a vehicular electronics system such as an automotive electronics system, a robot such as an industrial robot, an Internet of things device, a stereo system, a digital music player, a radio, a camera such as a digital camera, a portable memory chip, a home appliance such as a washer or a dryer, a peripheral device, a wrist watch, a clock, etc. Further, the electronic devices can include unfinished products.

Unless the context indicates otherwise, throughout the description and the claims, the words "comprise," "comprising," "include," "including" and the like are to generally be construed in an inclusive sense, as opposed to an exclusive or exhaustive sense; that is to say, in the sense of "including, but not limited to." Conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. The word "coupled", as generally used herein, refers to two or more elements that may be either directly coupled, or coupled by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively.

What is claimed is:

1. An impedance matching apparatus for providing impedance matching for a radio frequency component, comprising:
a balun transformer circuit including a primary coil at an input side of the balun transformer circuit, the primary coil being connected to a signal source to receive an input signal from the signal source, the balun transformer circuit further including a secondary coil at an output side of the balun transformer circuit, the secondary coil being coupled to the primary coil to supply an output signal to the radio frequency component and having a parasitic leakage inductance configured to match an output impedance of the signal source to an input impedance of the radio frequency component, the parasitic leakage inductance of the balun transformer circuit configured to include a predefined coupling factor, k, defined by an implemented gap, G, between the primary coil of the balun transformer circuit and the secondary coil of the balun transformer circuit.

2. The impedance matching apparatus of claim 1 wherein the predefined coupling factor, k, is further defined by an implemented offset between the primary coil and the secondary coil of the balun transformer circuit.

3. The impedance matching apparatus of claim 1 wherein the predefined coupling factor, k, is further defined by an implemented winding ratio, R, of a number of windings of the primary coil and a number of windings of the secondary coil.

4. The impedance matching apparatus of claim 1 wherein the primary coil and the secondary coil of the balun transformer circuit are implemented on different layers of an integrated circuit.

5. The impedance matching apparatus of claim 4 wherein a cross-section area of the primary coil overlaps with a cross-section area of the secondary coil of the balun transformer circuit to reduce a chip area of the balun transformer circuit within the integrated circuit.

6. A front-end module comprising:
a radio frequency component; and
an impedance matching apparatus to provide impedance matching for the radio frequency component, the impedance matching apparatus including a balun transformer circuit including a primary coil at an input side of the balun transformer circuit, the primary coil being connected to a signal source to receive an input signal from the signal source, and a secondary coil at an output side of the balun transformer circuit, the secondary coil being coupled to the primary coil to supply an output signal to the radio frequency component and having a parasitic leakage inductance used to match an output impedance of the signal source to an input impedance of the radio frequency component, the parasitic leakage inductance of the balun transformer circuit of the impedance matching apparatus configured to include a predefined coupling factor, k, defined by an implemented gap, G, between the primary coil of the balun transformer circuit and the secondary coil of the balun transformer circuit.

7. The front-end module of claim 6 wherein the predefined coupling factor, k, is further defined by an implemented offset between the primary coil and the secondary coil of the balun transformer circuit.

8. The front-end module of claim 6 wherein the predefined coupling factor, k, is defined by an implemented winding ratio, R, of a number of windings of the primary coil and a number of windings of the secondary coil.

9. The front-end module of claim 6 wherein the primary coil and the secondary coil of the balun transformer circuit are implemented on different layers of an integrated circuit.

10. The front-end module of claim 9 wherein a cross-section area of the primary coil overlaps with a cross-section area of the secondary coil of the balun transformer circuit to reduce a chip area of the balun transformer circuit within the integrated circuit.

11. A 5 G mm wave device comprising:
a front-end module including an radio frequency component and an impedance matching apparatus to provide impedance matching for the radio frequency component, the impedance matching apparatus including a balun transformer circuit including a primary coil at an input side of the balun transformer circuit, the primary coil being connected to a signal source to receive an input signal from the signal source, and a secondary coil at an output side of the balun transformer circuit, the secondary coil being coupled to the primary coil to supply an output signal to the radio frequency component and having a parasitic leakage inductance used to match an output impedance of the signal source to an input impedance of the radio frequency component, the parasitic leakage inductance of the balun transformer circuit of the impedance matching apparatus configured to include a predefined coupling factor, k, defined by an implemented gap, G, between the primary coil of the balun transformer circuit and the secondary coil of the balun transformer circuit.

12. The 5 G mm wave device of claim 11 wherein the predefined coupling factor, k, is defined by an implemented offset between the primary coil and the secondary coil of the balun transformer circuit.

13. The 5 G mm wave device of claim 11 wherein the predefined coupling factor, k, is defined by an implemented winding ratio, R, of a number of windings of the primary coil and a number of windings of the secondary coil.

14. The 5 G mm wave device of claim 11 wherein the primary coil and the secondary coil of the balun transformer circuit are implemented on different layers of an integrated circuit.

15. The impedance matching apparatus of claim 1 wherein the primary coil surrounds the secondary coil.

16. The impedance matching apparatus of claim 1 wherein the secondary coil has more windings than the primary coil.

17. The front-end module of claim 6 wherein the primary coil surrounds the secondary coil.

18. The front-end module of claim 6 wherein the secondary coil has more windings than the primary coil.

19. The 5 G mm wave device of claim 11 wherein the primary coil surrounds the secondary coil.

20. The 5 G mm wave device of claim 11 wherein the secondary coil has more windings than the primary coil.

* * * * *